United States Patent [19]

Chao

[11] Patent Number: 5,429,982

[45] Date of Patent: Jul. 4, 1995

[54] METHOD FOR GROWING FIELD OXIDES IN LOCOS TECHNIQUE

[75] Inventor: Tien S. Chao, Taiwan, Taiwan

[73] Assignee: National Science Council, Taipei, Taiwan

[21] Appl. No.: 192,565

[22] Filed: Feb. 7, 1994

[51] Int. Cl.⁶ .......................................... H01L 21/76
[52] U.S. Cl. ...................................................... 437/69
[58] Field of Search ...................................... 437/69, 72; 148/DIG. 85, DIG. 86, DIG. 117

[56] References Cited

U.S. PATENT DOCUMENTS 4,454,646  6/1984  Joy et al. .................................. 437/72
5,236,862  8/1993  Pfiester et al. .......................... 437/70

OTHER PUBLICATIONS

Stanley Wolf, *Solid State Technology* (Oct. 1992) pp. 53, 54, 56, 58, and 61.
Stanley Wolf, *Solid State Technology* (Nov. 1992) pp. 47 and 48.
Stanley Wolf, *Solid State Technology*, (Dec. 1992) pp. 39, 40, and 41.

*Primary Examiner*—George Fourson
*Attorney, Agent, or Firm*—Knobbe, Martens, Olson & Bear

[57] ABSTRACT

A method for growing field oxides in a LOCOS technique, including steps of a) pushing a wafer into a furnace, b) causing the furnace in an $N_2O$ atmosphere to grow a buffer oxide layer on the wafer, c) annealing the wafer, d) growing a silicon nitride layer on the buffer oxide layer, e) applying a photoresist layer on the silicon nitride layer, f) applying a desired mask to the wafer, g) etching undesired parts of the silicon nitride layer according to the mask, h) forming field oxides by an oxidation on where the undesired parts of the silicon nitride layer are etched, wherein the $N_2O$ atmosphere allows a layer of N atoms piling up at an interface between the wafer and the buffer oxide layer for reducing a rate of the oxidation and, consequently a bird's beak effect thereof. Such method can effectively grow field oxides in the LOCOS technique, which will reduce the bird's beak effect.

14 Claims, 7 Drawing Sheets

METHOD FOR GROWING FIELD OXIDES IN LOCOS TECHNIQUE

FIELD OF THE INVENTION

The present invention relates generally to a method for growing field oxides in the LOCOS (local oxidation of silicon) technique.

BACKGROUND OF THE INVENTION

In integrated circuits processes, the LOCOS (local oxidation of silicon) technique has been widely and mainly used for isolation between devices. This traditional technology normally causes a serious bird's beak effect and results in a larger required area for circuit components. Therefore, how to reduce the bird's beak effect is one of the main tasks in nowadays integrated circuits technique.

The conventional LOCOS technique includes the following steps:

1) pushing a wafer, which is first cleaned, into a furnace;

2) causing the furnace in an oxygen atmosphere at a temperature from about 900° C. to about 1100° C. to form a buffer oxide layer from about 100 Å to about 300 Å;

3) growing on the buffer oxide layer a silicon nitride layer having a thickness from about 1000 Å to about 2000 Å under a temperature from about 650° C. to about 850° C. by a low-pressure chemical vapor deposition;

4) applying a photoresist on the wafer;

5) applying a mask to the wafer;

6) etching undesired parts of the silicon nitride layer by a dry etch technique according to the mask;

7) forming the field oxides on where the undesired parts of the silicon nitride layer are etched by the wet oxidation technique at about 950° C. to about 1100° C. for about 1 hour to about 3 hours.

This conventional method has an advantage of being a simple procedure. Whereas, with the trend of the smaller and smaller size of the circuit component, this conventional method cannot meet our demand when the size of the circuit component is smaller than 0.5 µm.

For example, the buffer oxide layer obtained by exposing the wafer to $O_2$ has a thickness ranging from about 315 Å to about 415 Å. After the $Si_3N_4$ layer (about 1050 Å to about 1300 Å) is grown on the buffer oxide layer and then the field oxides (about 6000 Å to about 7000 Å) are grown in the wet oxygen atmosphere, as shown in FIG. 1, it is found that each side of the bird's beak according to this conventional LOCOS technique is about 5000 Å. That is to say, the prearranged distance should be about 1.25 µm to about 1.5 µm so that the required area is enough.

For a further explanation, according to the conventional LOCOS technique, one wafer is first cleaned (having a diameter about 6 inches, a direction (100), and a resistance about 15 Ω-cm to about 25 Ω-cm; and being p-type), grow a buffer oxide layer about 100 Å on the wafer at about 900° C. at a 10% $O_2$ and 90% $N_2$ atmosphere in a furnace, and then a $Si_3N_4$ layer about 1200 Å is grown on the wafer. After the undesired parts of the $Si_3N_4$ layer are removed, the wafer is pushed into a wet oxygen atmosphere at about 980° C. for 80 minutes to form thereon the field oxides and then the final product is obtained.

FIG. 2 is the SEM photograph of the above-mentioned example according to the conventional LOCOS technique, and it is found that by the conventional LOCOS technique, the length of the bird's beak (i.e., $X_1$) is 541.7 nm (5417 Å). This is not so satisfactory.

For reducing the bird's beak effect, there are many researches centered on this subject, such as the Semi-Recessed Oxide LOCOS, the Fully-Recessed Oxide LOCOS, and the Poly Buffered LOCOS. These methods can more or less reduce the bird's beak effect, but they have a common disadvantage: these methods need many extra steps which increase costs. Besides, these steps are also relatively complicated and troublesome.

It is therefore attempted by the Applicant to deal with the above situation encountered by the prior art.

SUMMARY OF THE INVENTION

One objective of the present invention is to provide a method for growing fields oxide in the LOCOS technique.

Another objective of the present invention is to provide a method for growing field oxides in the LOCOS technique, which will reduce the bird's beak effect.

In accordance with one aspect of the present invention, a method for growing field oxides in a LOCOS technique, includes steps of a) pushing a wafer into a furnace, b) causing the furnace in an $N_2O$ atmosphere to grow a buffer oxide layer on the wafer, c) annealing the buffer oxide-grown wafer, d) growing a silicon nitride layer on the buffer oxide layer, e) applying a photoresist layer on the silicon nitride layer, f) applying a desired mask to the photoresist-applied wafer, g) etching undesired parts of the silicon nitride layer according to the mask, and h) forming the field oxides by an oxidation on where the undesired parts of the silicon nitride layer are etched, wherein the $N_2O$ atmosphere allows a layer of N atoms piling up at an interface between the wafer and the buffer oxide layer for reducing a rate of the oxidation and, consequently a bird's beak effect thereof.

Preferably, the method can further include after step a) a step i) causing the furnace with $O_2$ atmosphere for growing the buffer oxide layer.

Preferably, the N atoms can diffuse into the buffer oxide layer for forming the layer of N atoms.

Preferably, the $N_2O$ atmosphere can thicken the buffer oxide layer which is grown at the $O_2$ atmosphere.

Preferably, the wafer can be first cleaned before the step a).

Preferably, a temperature for the furnace can range from about 900° C. to about 1000° C.

Preferably, the buffer oxide layer can have a thickness from about 100 Å to about 300 Å.

Preferably, the annealing procedure in the step c) can be executed from about 10 minutes to about 60 minutes.

Preferably, the silicon nitride layer can be deposited by a low-pressure chemical vapor deposition.

Preferably, the step d) can be executed under a temperature from about 650° C. to about 850° C.

Preferably, the silicon nitride layer can have a thickness ranging from about 1000 Å to about 2000 Å.

Preferably, the etching procedure can be executed by a dry etch.

Preferably, the oxidation in step h) can be executed in a wet oxygen.

Preferably, the step h) can be executed at a temperature from about 950° C. to about 1100° C.

Preferably, the step h) can be executed for about 1 hour to about 3 hours.

The present invention can be more fully understood by reference to the following description and accompanying drawings, which form an integral part of this application.

DETAILED DESCRIPTION OF THE PREFERRED EMBODIMENT

Figure 1:
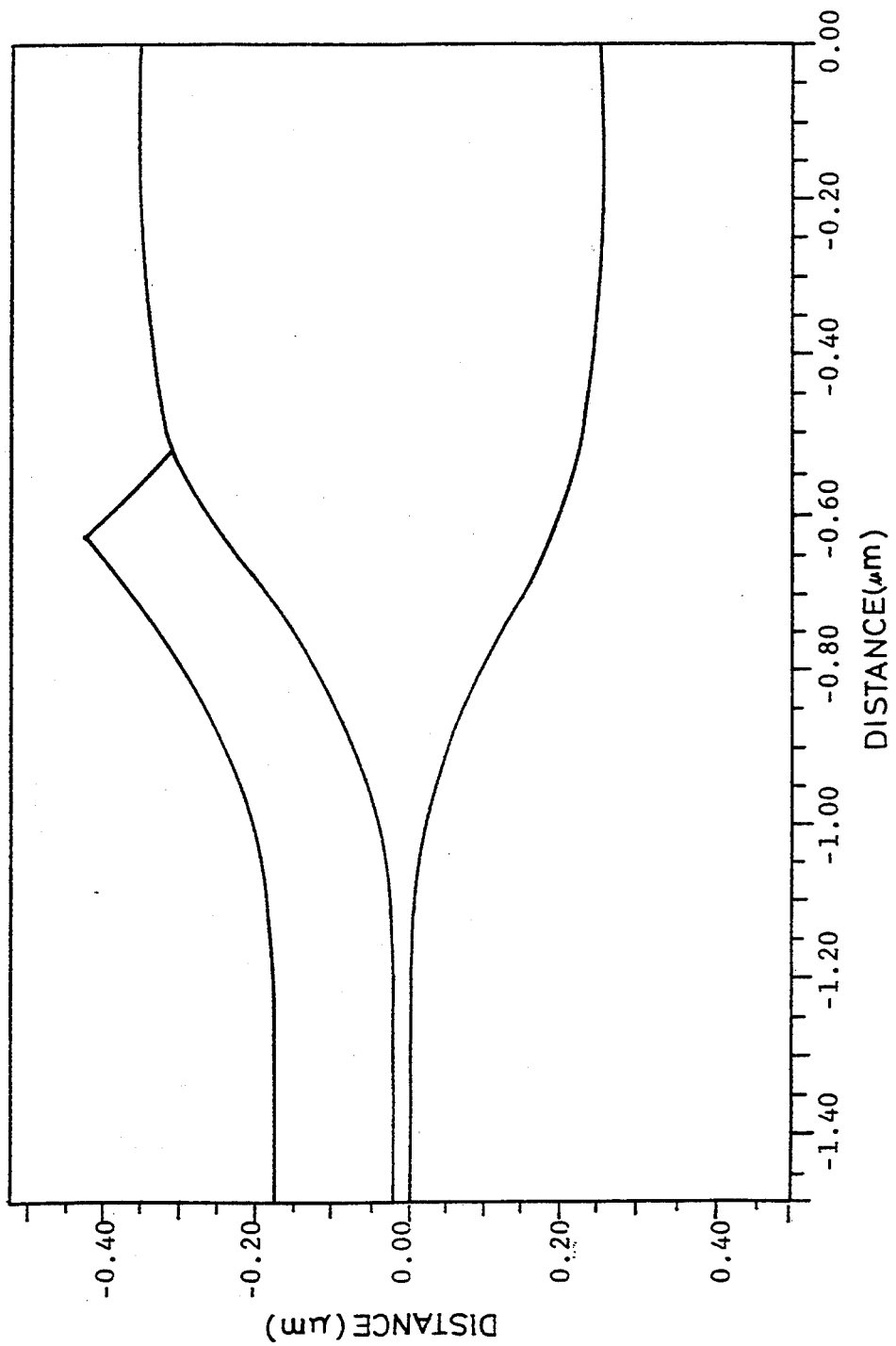
FIG. 1 shows a bird's beak effect resulting from a conventional LOCOS technique.

Referring to FIG. 3, the steps for the present method according to the present invention are described. The steps include a) pushing a wafer 20, after cleaned, into a furnace, b) providing the furnace with an $N_2O$ atmosphere to grow an buffer oxide layer 22 about 100 Å to 300 Å on the wafer 20 (FIG. 3A), c) annealing the buffer oxide-grown wafer 20, d) growing a silicon nitride layer 23 about 1000 Å to about 2000 Å on the oxide layer 22 by a low-pressure chemical vapor deposition (FIG. 3B), e) applying a photoresist layer on the silicon nitride layer 23, f) applying a desired mask to the wafer, g) etching an undesired part of the silicon nitride layer 23 according to the mask (FIG. 3C), and h) forming field oxides 24 by oxidation in a wet oxygen atmosphere at a temperature from about 950° C. to about 1100° C. for about 1 hour to about 3 hour on where the undesired parts of the silicon nitride 23 are etched (FIG. 3D), wherein the $N_2O$ atmosphere allows a layer of N atoms to pile up at an interface 21 between the wafer 20 and the buffer oxide 22 for reducing the oxidation rate thereof and, consequently reducing the bird's beak effect. After step a), the present method can further include a step: i) providing the furnace with an $O_2$ atmosphere for growing the buffer oxide layer. Therefore, the N atoms resulting from the $N_2O$ atmosphere can diffuse the buffer oxide layer for forming the layer of the N atoms. In addition, the $N_2O$ atmosphere can thicken the buffer oxide layer which is grown by the $O_2$ atmosphere.

The following equations summarize the reaction:

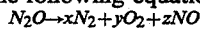

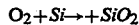

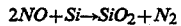

According to the above-mentioned equations, it can be explained why the layer of N atoms piling up at an interface between the wafer and the oxide is formed. The layer of N atoms can prevent the diffusion of the oxygen atoms and further can reduce the oxidation rate. Thus, the length of the bird's beak can be reduced.

For further comparing the present method and the conventional method, the Applicant designed an experiment as follows: Two wafers (having a diameter about 6 inches, a direction (100), and a resistance about 15 $\Omega$-cm to about 25 $\Omega$-cm; and being p-type) are first cleaned. A buffer oxide layer about 100 Å is grown on one wafer at about 900° C. at a 10% $O_2$ and 90% $N_2$ atmosphere in a furnace; and a buffer oxide layer about 100 Å on another wafer at about 900° C. at a $N_2O$ atmosphere in a furnace for about 100 minutes. Then, a $Si_3N_4$ layer about 1200 Å is grown on both wafers. After the undesired part of the $Si_3N_4$ layer is removed, the two wafers are pushed into a wet oxygen atmosphere at about 980° C. for 80 minutes to respectively form thereon field oxides and then the final products are obtained.

Figure 2:
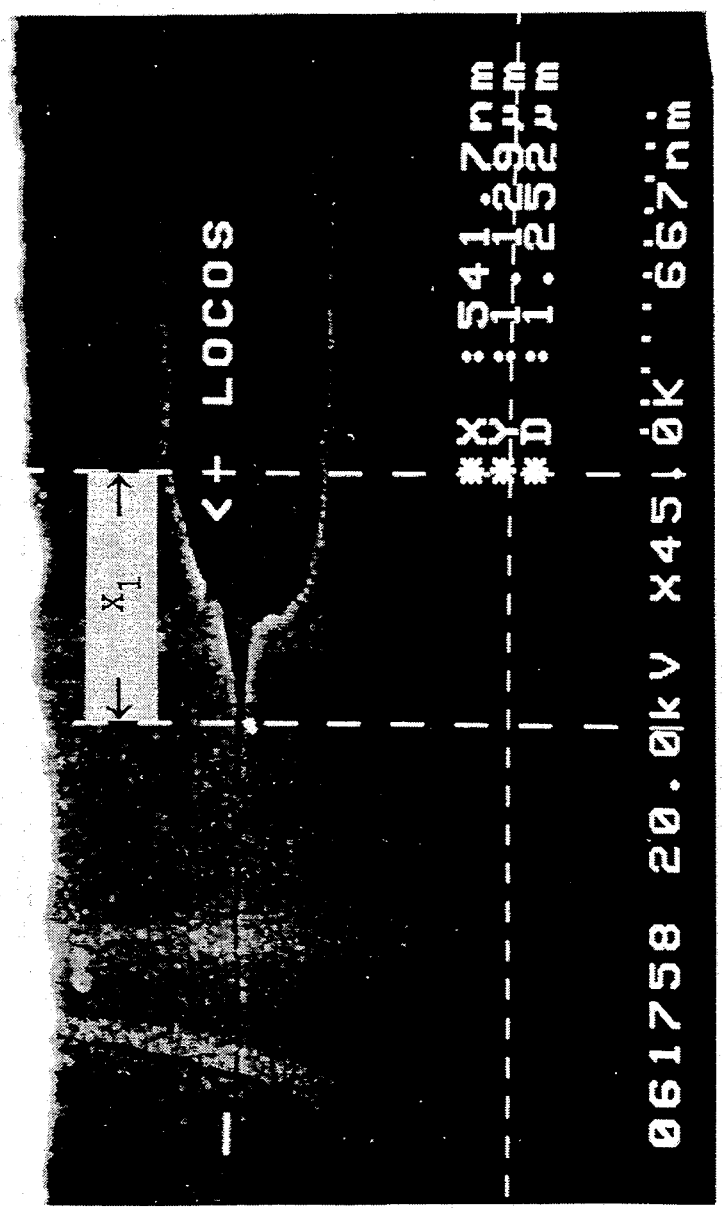
FIG. 2 is an SEM photograph showing the field oxide of the final product according to the conventional LOCOS technique.
Figure 3A:
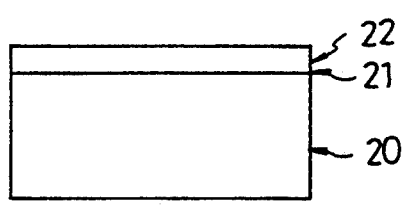
FIG. 3 shows steps for the present method according to the present invention.
Figure 3B:
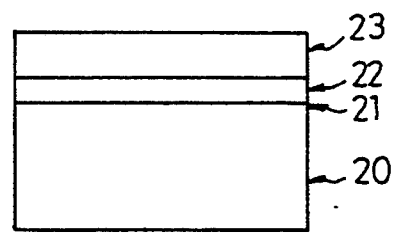
Figure 3C:
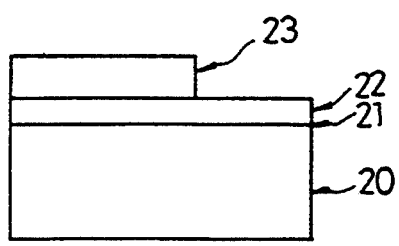
Figure 3D:
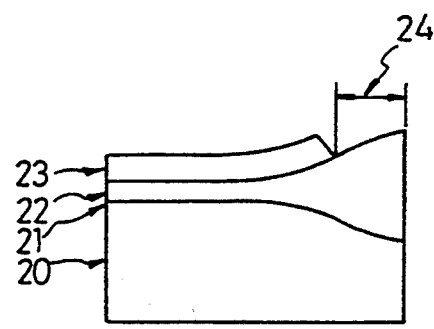
Figure 4:
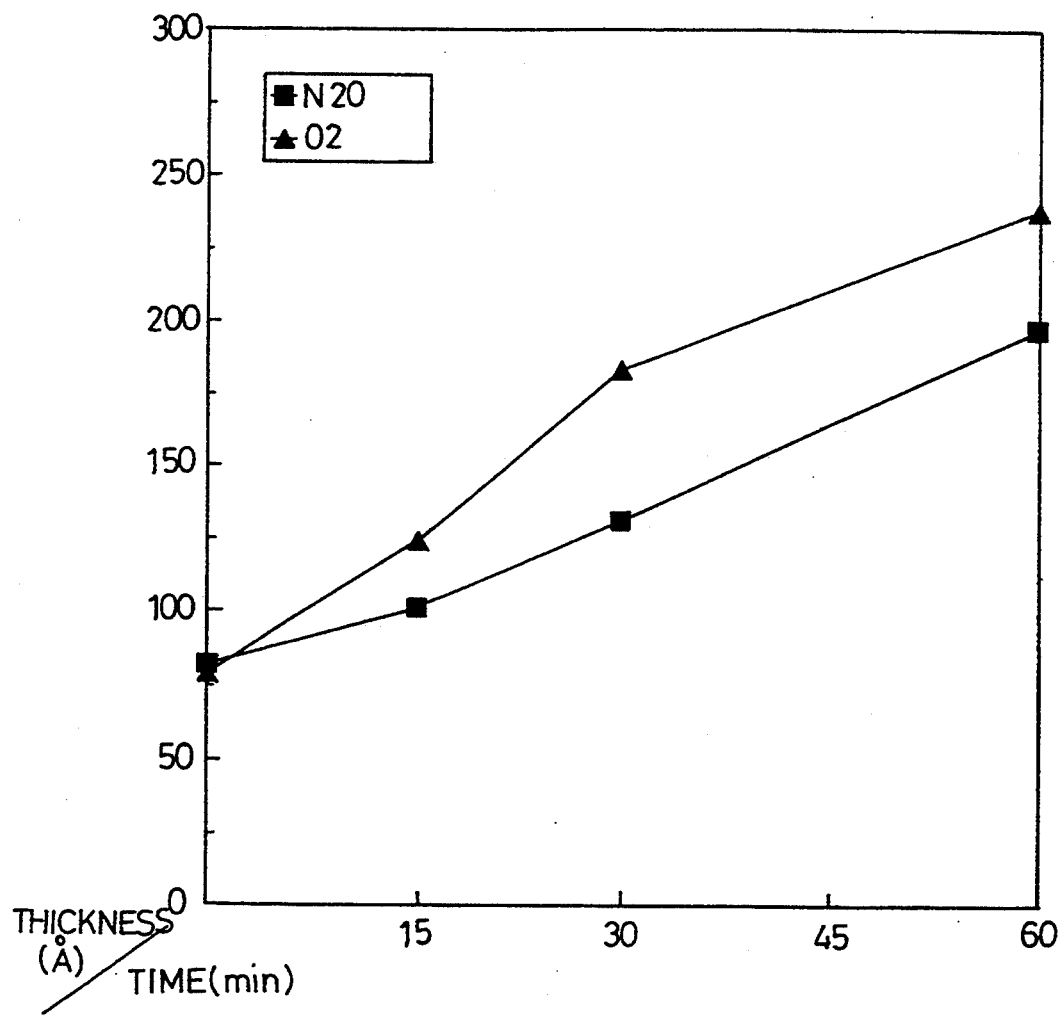
FIG. 4 respectively shows oxidation rates for the oxides for the present invention (applying $N_2O$) and the conventional LOCOS technique (applying $O_2$)
Figure 5:
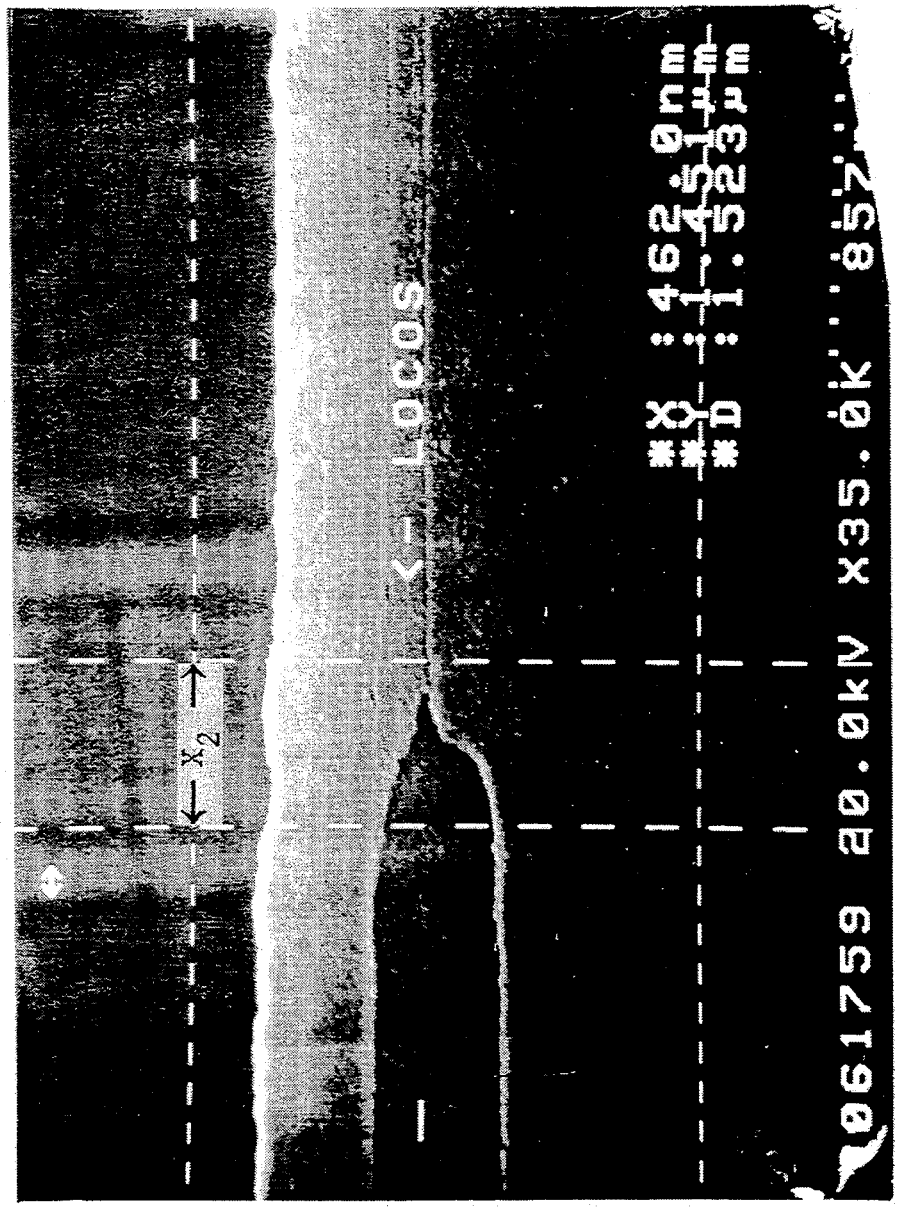
FIG. 5 is an SEM photograph showing the field oxide of the final products according to the present invention.

FIGS. 2 and 5 are the SEM photographs of the two examples according to the conventional LOCOS technique and the present invention. Referring again to FIG. 2, it is found that by the conventional LOCOS technique, the length of the bird's beak (i.e., $X_1$) is 541.7 nm; and whereas as shown in FIG. 5, by the present method, the length of the bird's beak (i.e., $X_2$) is 462.0 nm. It is obvious that the length of the bird's beak according to the present invention is relatively shorter than that by the conventional LOCOS technique.

Figure 6:
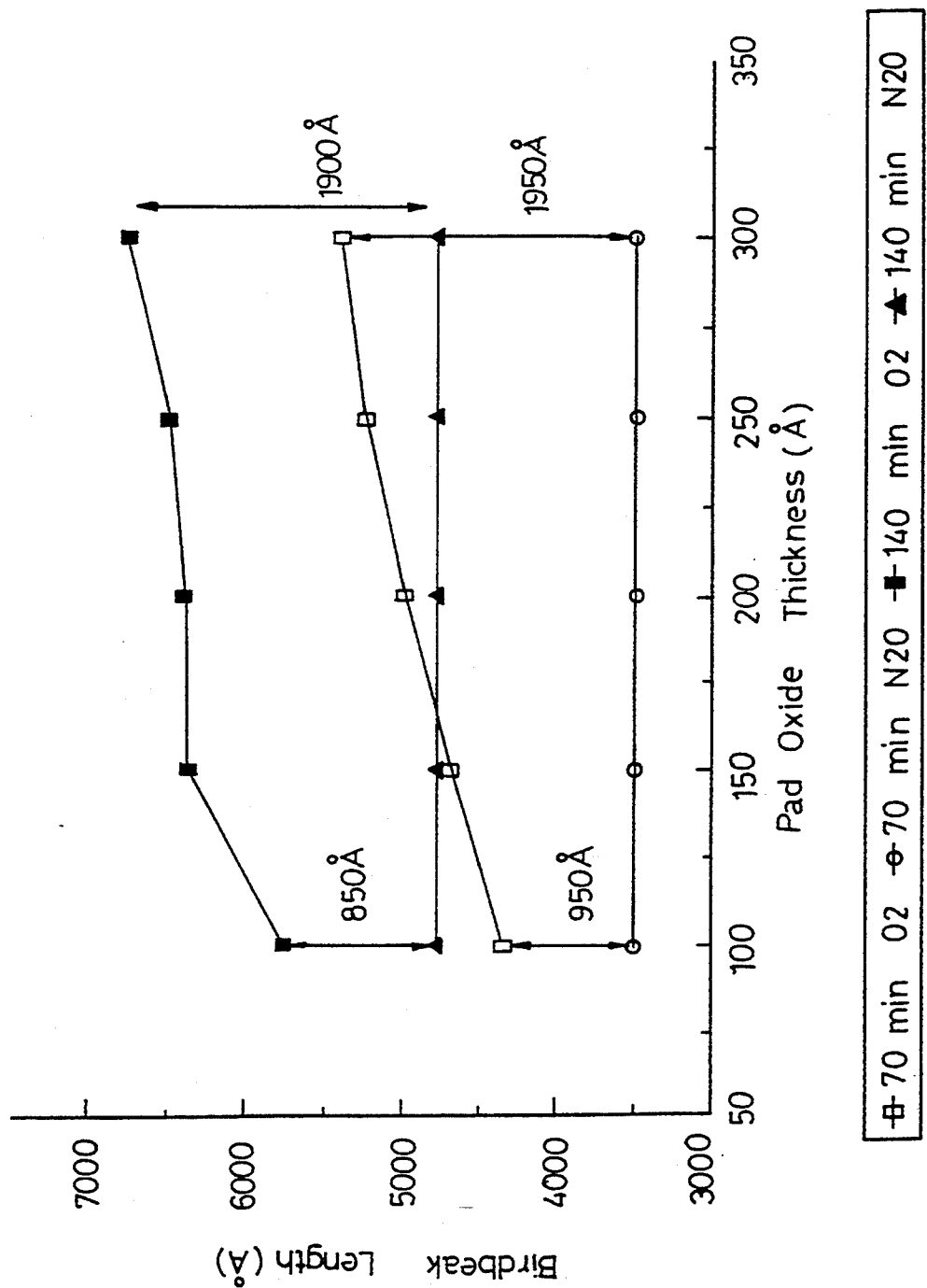
FIG. 6 schematically shows simulating results of SUPREM 4 respectively according to the conventional LOCOS technique and the present invention.

For more clear explanation, the SUPREM 4 (Stanford University Process Engineering Model IV) is used to simulate the manufacturing processes. As shown in FIG. 6, the test pieces (on which a $Si_3N_4$ layer about 1500 Å and a buffer oxide about 200 Å have been grown) are respectively oxidated at about 980 C. for about 140 minutes according to the conventional LOCOS technique and the present invention, by which it i found that according to the conventional LOCOS technique, the thicker the oxide layer, the longer the length of the bird's beak; but according to the present method, the length of the bird's beak slightly vary with respect to the different thicknesses of the oxide layer. Meanwhile, the differences in the lengths of the bird's beaks according to the conventional LOCOS technique and the present method range from about 850 Å to about 1900 Å with respect to the different thicknesses of the oxide layer. In a same manner, when the oxidation time is about 70 minutes, the differences in the lengths of the bird's beaks according to the conventional LOCOS and the present method vary from about 950 Å to about 1950 Å. Besides, according to the present method, the length of the bird's beak slightly varies with respect to the different thicknesses of the oxide layer. Thus, the present method for growing field oxides in the LOCOS technique is relatively excellent when compared to the conventional LOCOS technique.

Figure 7:
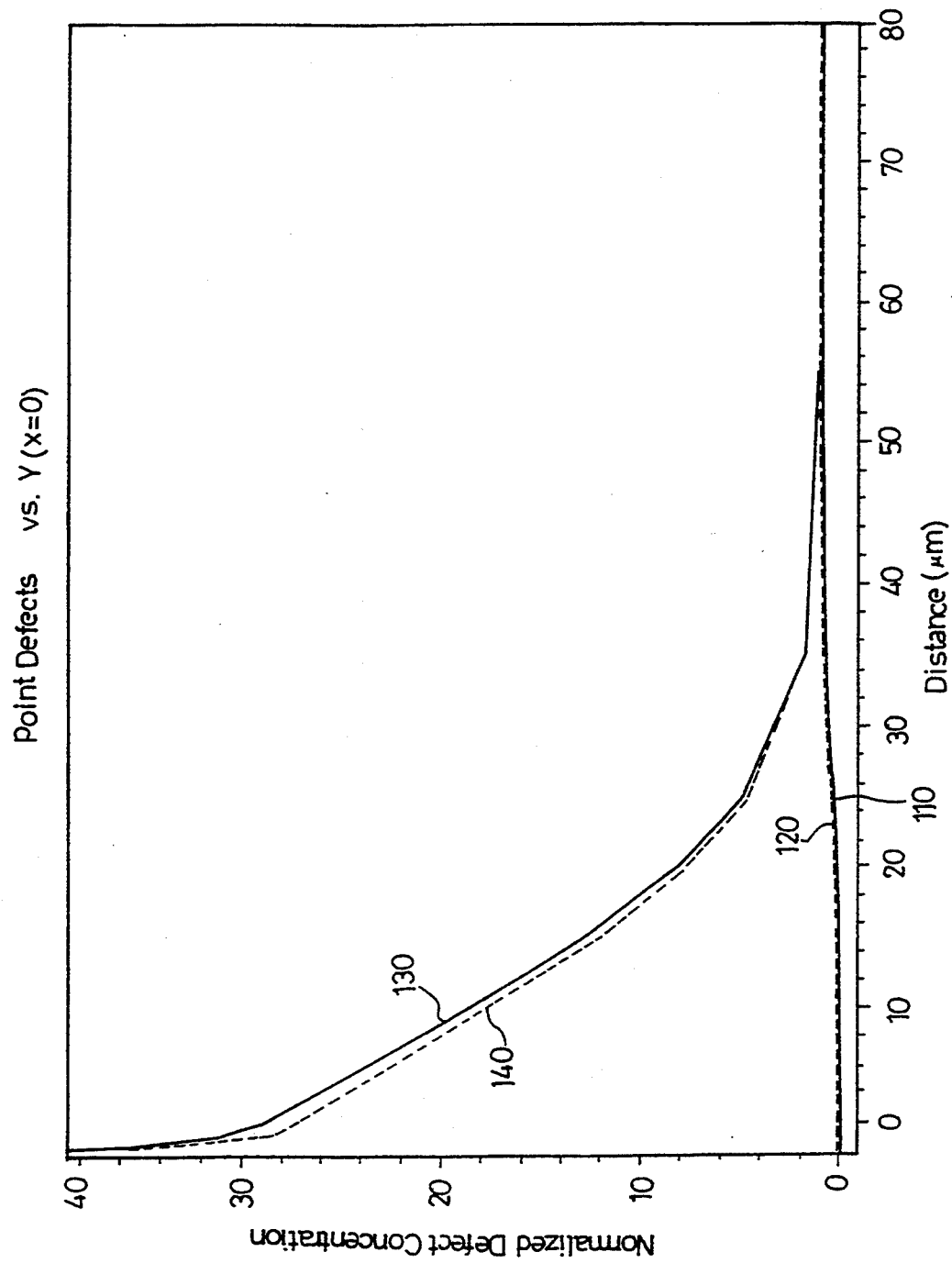
FIG. 7 respectively shows the defect concentrations of field oxides of the final products according to the conventional LOCOS technique and the present invention.

FIG. 7 is a figure showing a relation of point defects vs. Y (X=0), wherein the horizontal axis represents the distance in Y ($\mu$m) and the longitudinal axis represents the normalized defect concentration. As to the vacancies, the concentration of present method (represented by solid line 110) and the conventional LOCOS technique (represented by phantom line 120) have the similar properties. As to interstitials, the concentration of the present method (represented by the solid line 130) is only slightly larger than that of the conventional LOCOS technique (represented by the phantom line 140), but it doesn't matter. Therefore, the present method will not cause point defects to a harmful extent.

While the present invention has been described in connection with what is presently considered to be the most practical and preferred embodiment, it is to be understood that the invention is not to be limited to the disclosed embodiment but on the contrary, is intended to cover various modifications and equivalent arrangements included within the spirit and scope of the appended claims whose scope is to be accorded the broadest interpretation so as to encompass all such modifications and equivalent structures.

What is claimed is:

1. A method for growing field oxides in a LOCOS technique, comprising steps of:
   a) pushing a wafer into a furnace;
   b) providing said furnace with an atmosphere consisting essentially of $N_2O$ and growing a buffer oxide layer on said wafer and allowing a layer of N atoms to pile up at an interface between said wafer and said buffer oxide layer;
   c) annealing said buffer oxide-grown wafer;
   d) growing a silicon nitride layer on said buffer oxide layer;
   e) applying a photoresist layer on said silicon nitride layer;
   f) applying a mask to the resulting wafer;
   g) etching parts of said silicon nitride layer according to said mask to expose a portion of said wafer; and
   h) forming said field oxide by an oxidation on the exposed portion of said wafer.

2. A method according to claim 1, further comprising a step after step a) of providing said furnace with an atmosphere comprising $O_2$ for growing an additional buffer oxide layer on which said buffer oxide layer in step b) is integrally formed.

3. A method according to claim 1, wherein said N atoms diffuse into said buffer oxide layer for forming said layer of N atoms for reducing the rate of said oxidation and consequently the bird's beak effect thereof.

4. A method according to claim 1 wherein said wafer is first cleaned before said step a).

5. A method according to claim 1 wherein the temperature for said furnace in said step b) ranges from about 900° C. to about 1000° C.

6. A method according to claim 1 wherein said buffer oxide layer has a thickness from about 100 Å to about 300 Å.

7. A method according to claim 1 wherein said annealing procedure in said step c) is executed for about 10 minutes to about 60 minutes.

8. A method according to claim 1 wherein said silicon nitride layer is deposited by a low-pressure chemical vapor deposition.

9. A method according to claim 1 wherein said step d) is executed under a temperature from about 650° C. to about 850° C.

10. A method according to claim 1 wherein said silicon nitride layer has a thickness ranging from about 1000 Å to about 2000 Å.

11. A method according to claim 1 wherein said etching procedure is executed by a dry etch.

12. A method according to claim 1 wherein said oxidation in step h) is executed in a wet oxygen.

13. A method according to claim 1 wherein said step h) is executed at a temperature from about 950° C. to about 1100° C.

14. A method according to claim 1 wherein said step h) is executed for about 1 hour to about 3 hours.

* * * * *